United States Patent
Leijten-Nowak

(10) Patent No.: US 8,082,284 B2
(45) Date of Patent: Dec. 20, 2011

(54) IMPLEMENTATION OF WIDE MULTIPLEXERS IN RECONFIGURABLE LOGIC

(75) Inventor: Katarzyna Leijten-Nowak, Eindhoven (NL)

(73) Assignee: ST-Ericsson SA, Geneva (CH)

( * ) Notice: Subject to any disclaimer, the term of this patent is extended or adjusted under 35 U.S.C. 154(b) by 1250 days.

(21) Appl. No.: 10/507,807

(22) PCT Filed: Mar. 17, 2003

(86) PCT No.: PCT/IB03/00967
§ 371 (c)(1),
(2), (4) Date: May 9, 2005

(87) PCT Pub. No.: WO03/079550
PCT Pub. Date: Sep. 25, 2003

(65) Prior Publication Data
US 2005/0232297 A1   Oct. 20, 2005

(30) Foreign Application Priority Data
Mar. 18, 2002   (EP) ..................................... 02076049

(51) Int. Cl.
*G06F 7/38* (2006.01)
(52) U.S. Cl. ..................................................... 708/235
(58) Field of Classification Search ........... 708/200–235
See application file for complete search history.

(56) References Cited

U.S. PATENT DOCUMENTS

| | | | | |
|---|---|---|---|---|
| 5,233,539 A * | 8/1993 | Agrawal et al. | ............... | 708/232 |
| 5,426,379 A * | 6/1995 | Trimberger | ..................... | 326/39 |
| 5,436,514 A * | 7/1995 | Agrawal et al. | ............... | 708/230 |
| 5,448,186 A * | 9/1995 | Kawata | ........................... | 326/41 |
| 5,498,975 A * | 3/1996 | Cliff et al. | ........................ | 326/10 |
| 5,787,031 A * | 7/1998 | Ichikawa et al. | .............. | 708/653 |
| 6,118,300 A | 9/2000 | Wittig et al. | | |
| 6,154,049 A * | 11/2000 | New | ............................... | 326/39 |
| 6,188,240 B1 * | 2/2001 | Nakaya | ......................... | 708/232 |
| 6,339,341 B1 | 1/2002 | Fujii et al. | | |
| 6,369,610 B1 * | 4/2002 | Cheung et al. | ............... | 708/505 |
| 6,556,042 B1 * | 4/2003 | Kaviani | ........................ | 327/407 |
| 6,567,834 B1 * | 5/2003 | Marshall et al. | .............. | 708/626 |
| 6,816,562 B2 * | 11/2004 | Atkinson et al. | ................ | 326/39 |

FOREIGN PATENT DOCUMENTS

| | | |
|---|---|---|
| JP | 08-237109 | 9/1996 |
| JP | 09-181598 | 7/1997 |
| JP | 2000-232162 | 8/2000 |

OTHER PUBLICATIONS

International Search Report dated Dec. 9, 2003 in connection with PCT Patent Application No. PCT/IB2003/00967.

(Continued)

*Primary Examiner* — Chat C Do

(57) ABSTRACT

A reconfigurable processing device comprises one or more reconfigurable processing units. At least one processing unit utilizes a computational unit having a preprocessing module for receiving n input signals, and s1 selection signals, and providing k output signals wherein k<n+s1. The computational unit further comprises an m-output look-up table being addressed by the k output signals of the preprocessing module and an output multiplexer for selecting one of the m output signals of the look-up table under control of s2 further selection signals.

14 Claims, 4 Drawing Sheets

OTHER PUBLICATIONS

S. Chattopadhyay, et al., "Technology Mapping on a Multi-Output Logic Module built around Cellular Automata Array for a new FPGA Architecture", 8th International Conference on VLSI Design, IEEE, Jan. 1995, p. 57-62.

Cong J., et al., "Synthesis challenges for next-generation high-performance and high-density PLDs", Design Automation Conference, Proceedings of the ASP-DAC, 2000, Asia and South Pacific, p. 157-162.

Jason Cong, et al.,, "Synthesis Challenges for Next-Generation High-Performance and High-Density PLDs", Aplus Design Technologies, 59 pages.

* cited by examiner

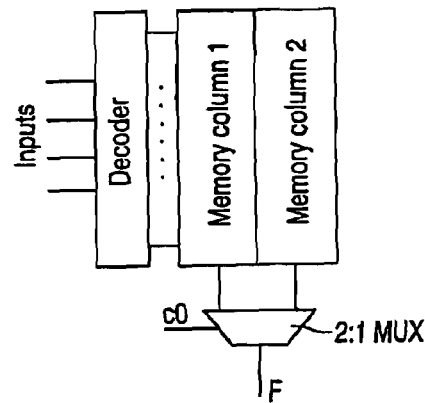
FIG. 3
PRIOR ART
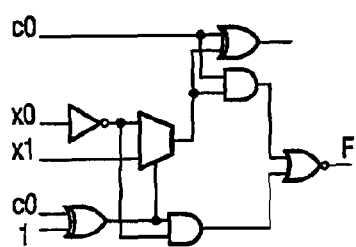 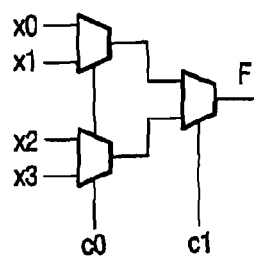 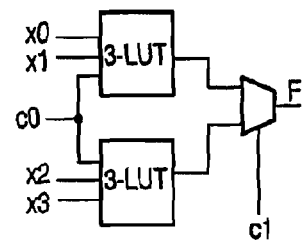
FIG. 4A
PRIOR ART
FIG. 4B
PRIOR ART
FIG. 4C
PRIOR ART
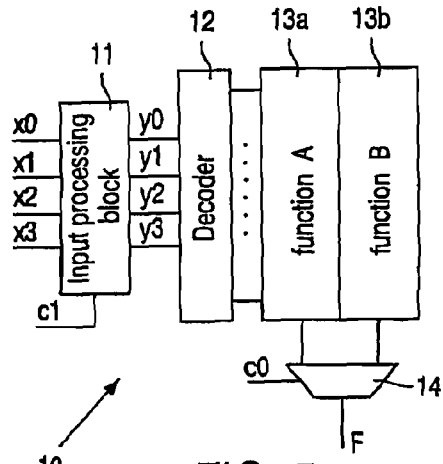
FIG. 5

IMPLEMENTATION OF WIDE MULTIPLEXERS IN RECONFIGURABLE LOGIC

CROSS-REFERENCE TO RELATED APPLICATION(S)

The present application claims priority under 35 U.S.C. §365 to International Patent Application No. PCT/IB03/00967 filed Mar. 17, 2003, entitled "IMPLEMENTATION OF WIDE MULTIPLEXERS IN RECONFIGURABLE LOGIC". International Patent Application No. PCT/IB03/00967 claims priority under 35 U.S.C. §365 and/or 35 U.S.C. §119(a) to European Patent Application No. 02076049.2 filed Mar. 18, 2002 and which are incorporated herein by reference into the present disclosure as if fully set forth herein.

TECHNICAL FIELD

The present invention relates to a reconfigurable processing device.

BACKGROUND

Reconfigurable logic (RL) is used to implement functions which are unknown at the design time. To enable this reconfigurable logic architectures are made generic in the sense that various logic functions can be mapped onto them. Although this offers flexibility to a user, at the same time it leads to a large area overhead compared with the logic which would be required for a standard ASIC implementation, for example. Because of this, a basic computational element of traditional reconfigurable logic devices (such as field programmable gate arrays (FPGAs)), the so called logic cell, contains only a limited amount of logic resources, e.g. look-up tables. Moreover, the resources of a logic cell are chosen in such a way that they reflect the common requirements of different applications. However, if coarser or more specialised functions are to be mapped, usually either much more logic cells are required or such functions cannot be mapped at all.

Reconfigurable logic devices comprise data flow controlling elements such as multiplexers, demultiplexers, gates etc and dataflow manipulating elements, such as logical gates, adders and lookup tables. The latter allow implementation of various functions, which can be redefined easily by loading them with a different content. Reconfigurable logic devices further comprise configuration memory units (configuration memory) for storing settings of data flow controlling elements, such as multiplexers, demultiplexers, switches etc. In this way connections between different parts of the reconfigurable processing unit can be rapidly redefined. Control signals for the memory cells are generated by an address decoder in response to an address offered at the input thereof.

In particular multiplexers of different sizes and with different operand widths are heavily used in random logic as well as data-path applications. Despite that, in a large majority of traditional reconfigurable logic architectures, there is support for the implementation of small multiplexers only. This limitation has two reasons:
1. A specific type of a logic cell which hampers a multiplexer implementation.
2. A limited number of logic cell inputs which causes that a logic cell cannot obtain a required number of signals from the routing resources.

For applications, in which wide multiplexers are heavily used (e.g. DSP data-paths, cryptography, networking), this is an important limitation. Although, this is particularly an issue for architectures with multi-bit output LUTs (moLUTs), any current FPGAs, both fine- and coarse-grained, face this problem in some way.

SUMMARY

It is an object of the invention to provide a reconfigurable processing device which allows for the implementation of relatively large multiplexers also in architectures using multi-bit output LUTs. In order to achieve this object the reconfigurable processing device is defined by claim 1.

In the reconfigurable processing device according to the invention, the preprocessing module reduces the number of signals, i.e. number n of input signals, and the number s1 of selection signals, to a smaller set of k output signals. The combination of the preprocessing module and the look-up table now can handle a relatively large number of input signals as compared to the look-up table alone.

Preferably the look-up table is implemented according to the definition of claim 2. This has the advantage that the decoder can be used both for writing and reading the table. The storage unit could also be used for temporarily storing data which is calculated in the reconfigurable processing device.

A practical embodiment is described in claim 3. In this embodiment the preprocessing unit can have a relatively small number of gates.

The embodiment of claim 4 introduces additional flexibility to the reconfigurable device, in that it renders it possible to configure the computational unit either as a multiplexer, or as a general look-up table.

Claim 5 provides an efficient way to implement an even wider multiplexer.

Claim 6 claims a computational unit provided with an input multiplexer for selecting signals available at a communication network. In particular for this purpose wide input multiplexers are important to enable a high degree of flexibility in coupling different reconfigurable processing units of a reconfigurable processing device to each other. The input multiplexer can be configured either statically or dynamically. In the statical case the selection made by the input multiplexer is determined by the values stored in the configuration memory. In the dynamical case the selection made by the input multiplexer is determined during runtime by signals available at the communication network. In case of a computational unit with a plurality of input pins, each of the pins or a part thereof may be coupled to a multiplexer in this way.

BRIEF DESCRIPTION OF THE DRAWINGS

These and other aspects of the invention are described in more detail with respect to the drawing. Therein:

FIG. 3 shows a conventional element used in a reconfigurable processing device, FIGS. 4A, 4B and 4C shows three conventional approaches for implementing multiplexers in prior art reconfigurable devices, FIG. 5 shows an embodiment according to the invention.

DETAILED DESCRIPTION

Figure 1:
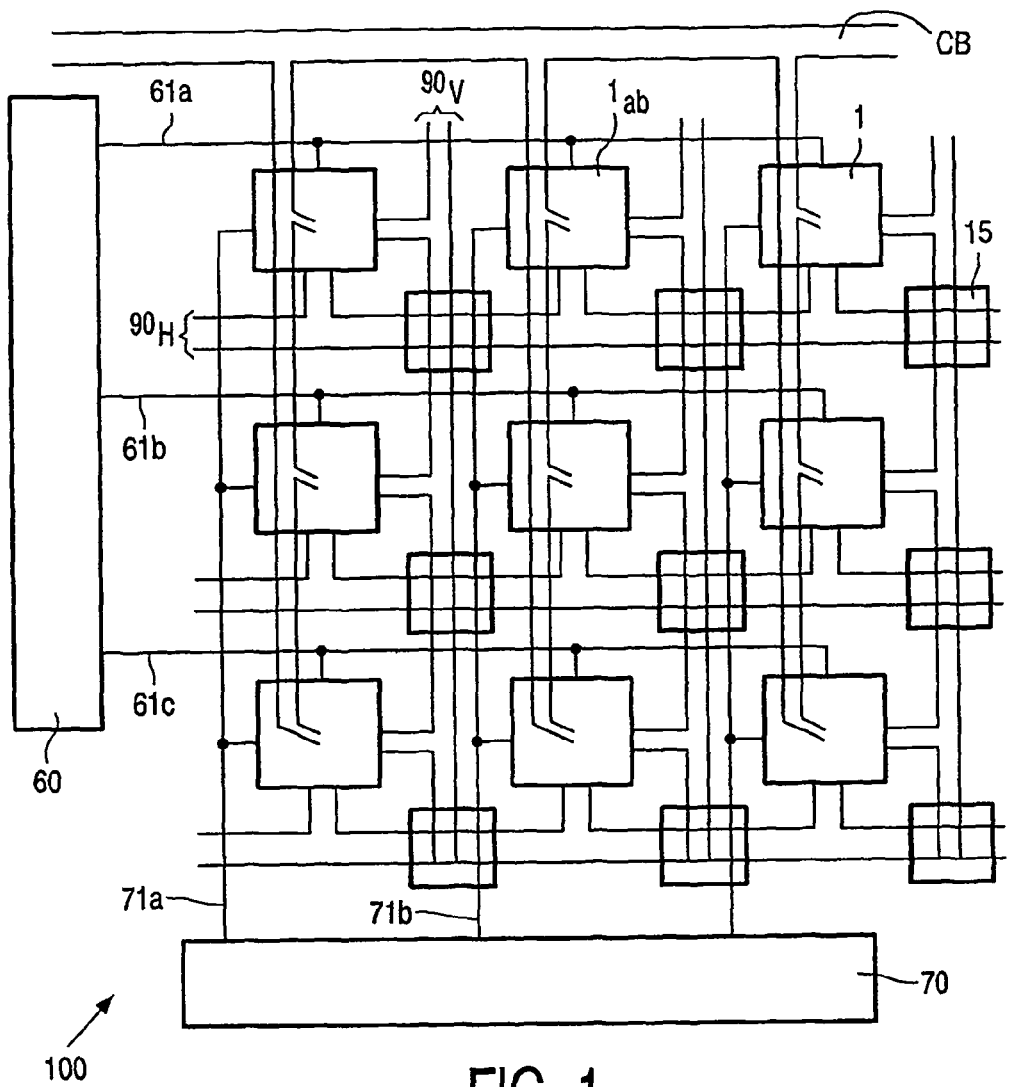
FIG. 1 schematically shows a reconfigurable processing device.

FIG. 1 shows a reconfigurable processing device 100 comprising one or more reconfigurable processing units 1. The units 1 may communicate to each other via a communication network comprising horizontal buses $90_H$ and vertical buses $90_V$. The units 1 are connected to configuration bus CB, comprising an address bus and a data bus and control signals for allowing configuration data to be loaded in a configuration memory which controls the functioning of the units 1. In the embodiment shown the reconfigurable processing device 100 comprises a first 60 and a second global decoder 70 which respectively activate a first control line, e.g. 61a and a second control line e.g. 71b. The reconfigurable processing unit, here 1ab selected by the control lines is then reconfigured with the data from the configuration bus CB. In another embodiment the reconfigurable processing device 100 may only have local address decoders. In again another embodiment the reconfigurable processing device has no decoder at all, for example in an embodiment wherein the configuration storage units are arranged in a chain. In that case configuration takes place by subsequentially shifting the configuration data in the chain.

Figure 2:
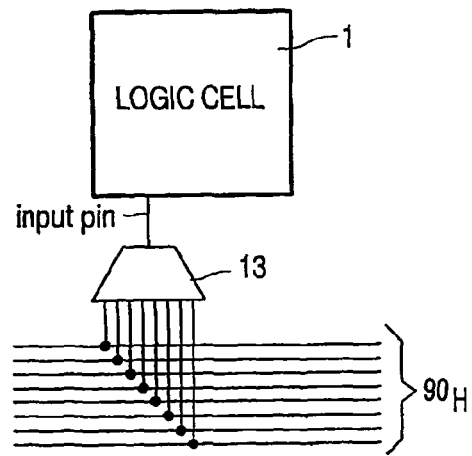
FIG. 2 shows in more detail the coupling between a reconfigurable processing unit and a communication network.

For many purposes it is necessary to select input signals for a reconfigurable processing unit 1 from a plurality of signals available in the communication network. FIG. 2 shows an example wherein the multiplexer 13 selects an input signal from the signals available at a horizontal bus $90_H$ of the communication network.

Reconfigurable logic architectures with multi-bit output LUTs (moLUTs), have shown to offer multi-functionality at a reduced implementation cost. The most common way of implementing moLUTs is similar to traditional SRAMs, this is by using one decoder for addressing several (LUT) memory columns. A 4-input LUT is found to be the most area-efficient for random logic implementation. For that reason, a 4-input LUT is typically used in the implementation of the moLULT-based devices. The LUT type determines the total number of logic cell input pins. Thus, a device with a 4-input moLUT will have four pins. If an additional 2:1 multiplexer is placed at the LUT outputs, it will result in maximally five pins (see FIG. 3). This is not enough even to implement a 4:1 multiplexer, which requires six inputs (four primary and two selection inputs). Thus, typically only very small multiplexers can be implemented in such devices.

FIG. 4A, 4B, 4C show some prior art implementations of a multiplexer. FIG. 4A shows a first approach, in which the multiplexer is implemented by dedicated circuitry. In such architectures the multiplexer function is implemented by programming connections in a fixed topology of logic gates as well as by the selection of right operands for them (e.g. constants).

The second approach, shown in FIG. 4B, is characteristic for the multiplexer-based devices as designed by Actel. In such devices, a logic function is implemented by programming multiplexer inputs in a way required by the mapped function. The multiplexer-based reconfigurable logic devices are of a fine granularity and contain a small set of 2:1 multiplexers (usually three). Thus, maximally a 4:1 multiplexer can be implemented in such a structure.

The third type of implementation as shown in FIG. 4C assumes the use of look-up tables (LUTs), which is typical for most of the current FPGAs, e.g from Atmel and Xilinx.

According to this approach, look-up tables in a logic cell implement single multiplexers of the limited size (typically a 4:1 multiplexer), while wider multiplexers are created by using additional 2:1 multiplexers present at the look-up table outputs.

FIG. 5 shows a computational unit in an embodiment of a reconfigurable processing device according to the invention. The computational unit 10 comprises a preprocessing module 11 for receiving n=4 input signals x0, x1, x2, x3, and s1=1 selection signals, signal c1 and providing k=4 output signals y0, y1, y2, y3, wherein k<n+s1. It further comprises a m=2-output look-up table 12, 13a, 13b, being addressed by the k output signals of the preprocessing module, and an output multiplexer 14 for selecting one of the m=2 output signals of the look-up table 12, 13a, 13b under control of s2=1 further selection signals as the output signal F.

The basic idea behind the method proposed here is based on the decomposition of the multiplexer function in such a way, that it can be mapped onto the multi-bit output LUT which has been enhanced with a small amount of extra logic. By way of example, this is shown for the implementation of a 4:1 multiplexer on the multi-bit output LUT with 4-inputs and 2-outputs (4/2-LUT).

A 4:1 multiplexer can be described by a logic function F of six variables: $x_0, x_1, x_2, x_3$, being inputs of the multiplexer and $c_0, c_1$ being control (selection) signals, as shown by the following equation:

$$F(x_0,x_1,x_2,x_3,c_0,c_1)=\overline{c_0}\cdot\overline{c_1}\cdot x_0+c_0\cdot\overline{c_1}\cdot x_1+\overline{c_0}\cdot c_1\cdot x_2+c_0\cdot c_1\cdot x_3 \quad (1)$$

This equation can be further modified to the form:

$$F(x_0,x_1,x_2,x_3,c_0,c_1)=\overline{c_0}\cdot A+c_0\cdot B, \text{ wherein:} \quad (2)$$

$$A=\overline{c_1}\cdot x_0+c_1\cdot x_2, \text{ and} \quad (3a)$$

$$B=\overline{c_1}\cdot x_1+c_1\cdot x_3 \quad (3b)$$

Eqn 2 describes a 2:1 multiplexer with inputs A, B, and $c_0$ being a control signal. This multiplexer can be mapped onto the 2:1 multiplexer which is present at the outputs of the 4/2-LUT. Such a mapping is possible only if both functions A and B can be encoded in the memories (memory columns) of the moLUT. Functions A and B require in total five different logic variables while the given 4/2-LUT has only four inputs. However, all partial products of the A and B functions share the same logic variable $c_1$. If it is assumed that these partial products. $\overline{c_1}\cdot x_0, \overline{c_1}\cdot x_1, c_1\cdot x_2, c_1\cdot x_3$ are generated outside the LUT, than the partial product results $y_0, y_1, y_2, y_3$ can be treated as inputs of this LUT. Thus, a 4/2-LUT implements functions A and B of the form as in Eqn. 4

$$A=y_0+y_2, \text{ and} \quad (3b)$$

$$B=y_1+y_3 \quad (4b)$$

The only modification required with respect to the standard 4/2-LUT implementation is a relatively small preprocessing unit 11.

The above described principle is not limited to the implementation of 4:2 multiplexers. Analogously any selection function F:

$$F(x_0,\ldots,x_k,c_0,\ldots,c_L)=\overline{c_0}\cdots\overline{c_L}\cdot x_0+\ldots+c_0\cdot c_L\cdot x_k \quad (5)$$

for selecting an output signal from input signals $x_0,\ldots x_k$ may be rewritten in the form $$F(x_0,\ldots,x_k,c_0,\ldots,c_L)=\overline{c_0}\cdot A+c_0\cdot B, \quad (6)$$

where A is a function of the variables $x_0, x_2, \ldots, x_{2i}$ and $c_1,\ldots c_L$, and B is a function of the variables $x_1, x_3, \ldots x_{2i+1}$, and $c_1,\ldots c_L$. The function A on its turn can be rewritten as the logical OR of the variables $y_0$, $y_2$, $y_{2i}$, wherein yi is a function which only depends on the variable xi and the selection variables $c_1, \ldots c_L$.

Likewise the function B can be rewritten as the logical OR of the variables $y_1$, $y_3$, $y_{2i+1}$, wherein yi is a function which only depends on the variable xi and the selection variables $c_1, \ldots c_L$. Again, the functions $y_i$ can be calculated with a preprocessing unit, while the resulting function F is calculated from the values of yi and the remaining selection variables $c_1, \ldots c_L$.

The preprocessing unit for generating the values $y_i$ is characterized in that the number n of input signals $x_i$ is equal to the number k of output signals $y_i$ and that the preprocessing unit has a first input for receiving a first selection signal $c_1$, as well as further inputs for receiving the further selection signals $c_2, \ldots c_L$. The preprocessing unit generates in response to each of the input signals $x_i$ an output signal $y_i$. For one half of the output signals $y_i$ the value is the logical AND function of the corresponding input signal xi and the first selection signal $c_1$ and for another half of the output signals $y_i$ the value is the logical AND function of the corresponding input signal $x_1$ and the inverse of the first selection signal $c_1$.

Figure 6:
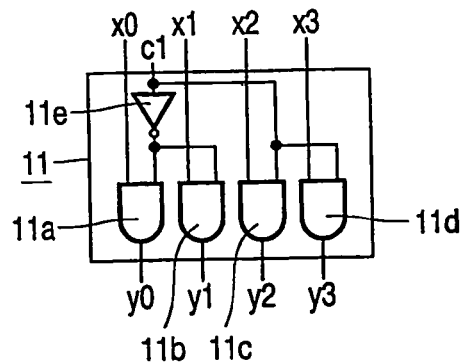
FIG. 6 shows an implementation of a preprocessing unit.

By way of example FIG. 6 shows a preprocessing unit 11 in a practical embodiment of the invention. The preprocessing unit comprises 4 logical AND gates 11a, 11b, 11c, 11d, and an inverter 11e to calculate the values $y_0, \ldots y_3$. The values $y_0$ and $y_1$ are realized by the logical AND function of their corresponding input signals $x_0$, $x_1$ and the inverse of the first selection signal $c_1$. The values $y_2$ and $y_3$ are realized by the logical AND function of their corresponding input signals $x_2$, $x_3$ and first selection signal $c_1$ itself.

Figure 7A:
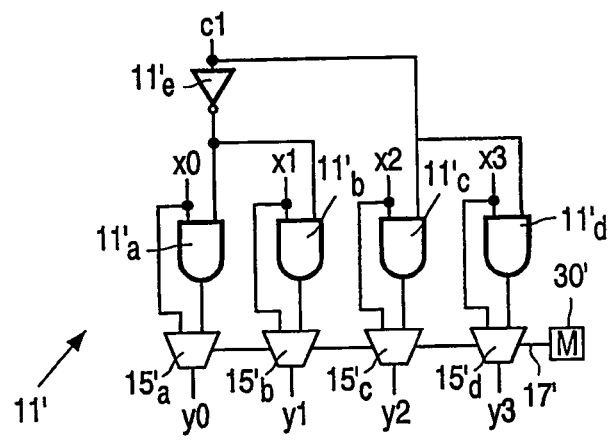
FIGS. 7A and 7B show two alternative embodiments for the preprocessing unit.
Figure 7B:
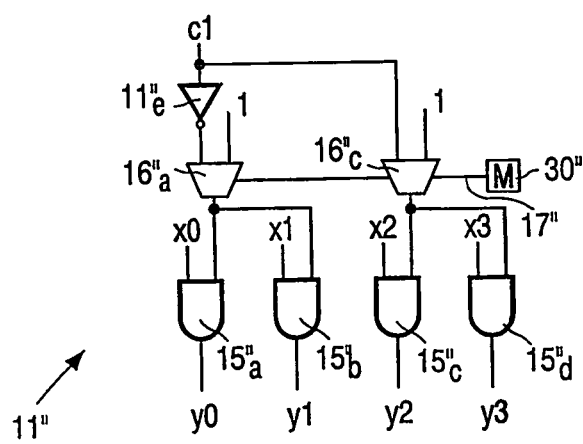

Preferably the preprocessing module comprises a mode select input for selecting a further operational mode, in which further operational mode the output signals $y_i$ are identical to their corresponding input signals $x_i$. If a logic function of only four inputs is to be implemented in the modified 4/2-LUT, than the input processing block can be either bypassed FIG. 7A or it can be used in such a way that the primary logic inputs are passed through it without any conversion. In FIG. 7A parts being referred to by reference numbers having a quote (') correspond to parts having the same reference number in FIG. 6. In FIG. 7B parts referred to by reference numbers having a double quote correspond to parts having a single quote in FIG. 7A.

In the embodiment shown in FIG. 7A each of the AND gates 11a', ... 11d' is coupled to an output via a respective auxiliary multiplexer 15a', ... 15d'. The multiplexers are coupled via a control input 17' of the preprocessing unit 11' to an output of the configuration memory 30'.

In the embodiment of FIG. 7B the signal of the inverter 11e" is bypassed in the further operational mode. To that end the auxiliary multiplexers 16a" and 16c" are coupled to control input 17" which is coupled to configuration memory 30". In the further operational mode the auxiliary multiplexers select the logical value 1 as their output signals. The result is that each of the output signals $y_i$ is equal to $x_i$. An additional advantage is that the auxiliary multiplexers 16a" and 16c" do not delay the signals $y_0, \ldots y_3$.

Figure 8:
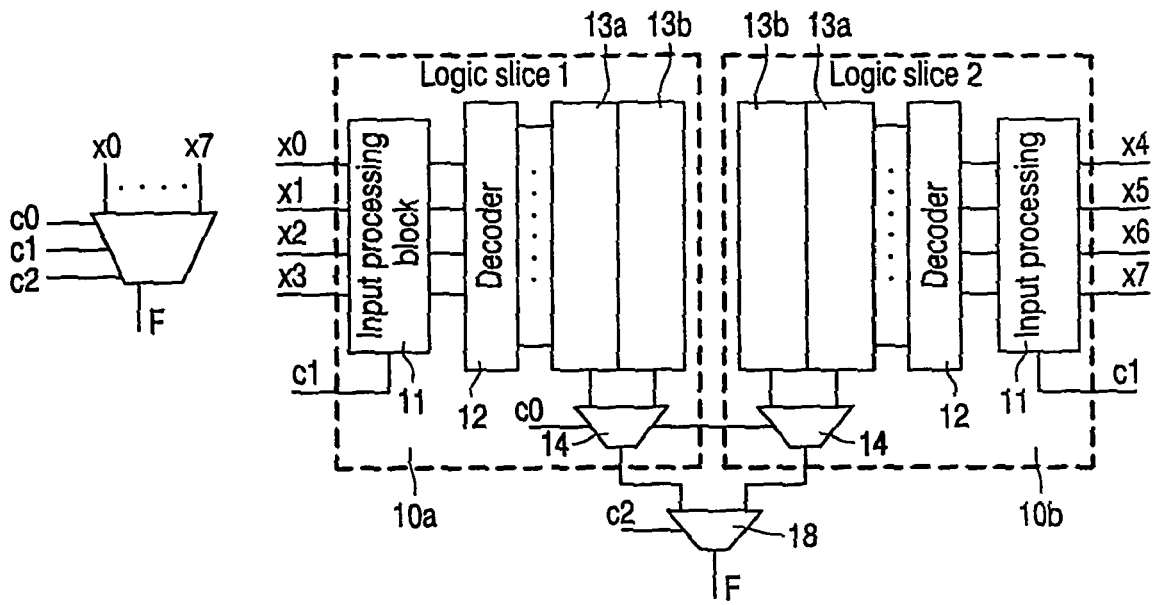
FIG. 8 shows a further embodiment of the invention.

FIG. 8 shows a further embodiment of a reconfigurable processing device according to the invention claim 1. It comprises an enlarged computational unit having a first 10a and a second computational unit 10b. Each of the computational units 10a, 10b comprises a preprocessing module, a m-output look-up table, and an output multiplexer. In the embodiment shown the computational units 10a, 10b are identical to the one shown in FIG. 5. The enlarged computational unit shown in FIG. 8 further comprises a further multiplexer 18 for selecting an output signal of either the first 10a or the second unit 10b as its output signal F in response to a further selection signal c2.

Figure 9:
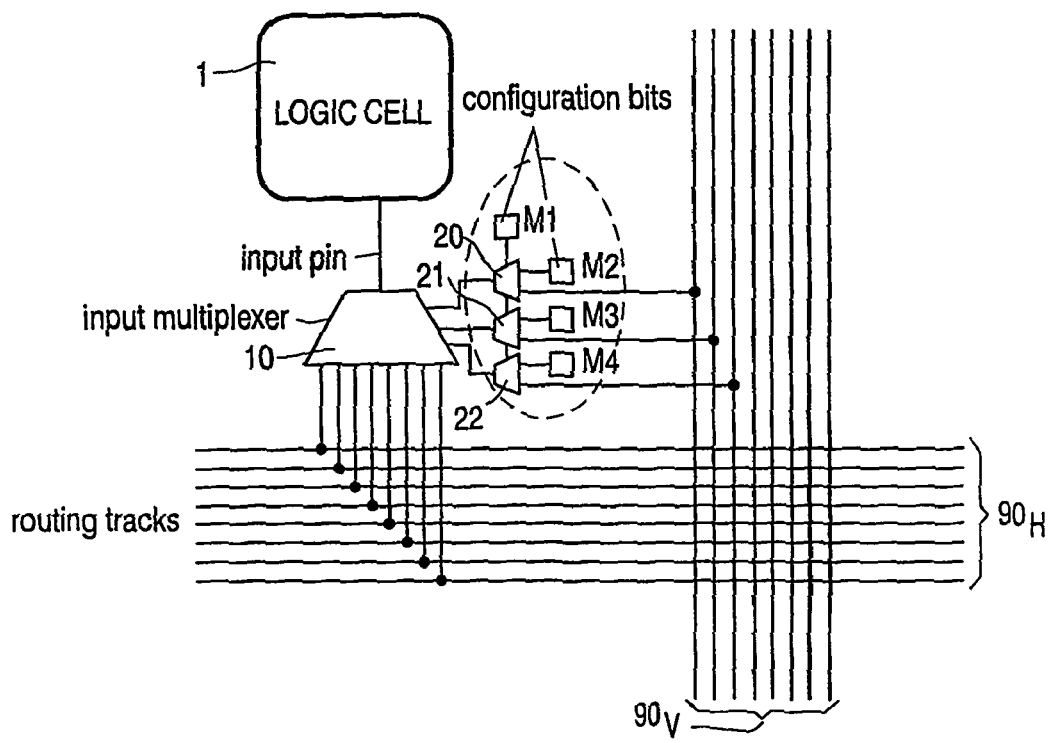
FIG. 9 shows a computational unit having an input multiplexer which is configurable statically or dynamically.

FIG. 9 shows a reconfigurable processing device wherein the computational unit 10 is arranged as an input multiplexer for a reconfigurable logic unit 1. The computational unit 10 selects an input signal for the reconfigurable logic unit 1 from signals available at a communication network $90_H$, $90_V$. Although in the embodiment of FIG. 9 the reconfigurable logic unit 1 has only one input, it may have a plurality of inputs. Each, or a paret of those inputs may be coupled to a computational unit 10 which is arranged as an input multiplexer.

In the embodiment shown in FIG. 9 the selection signals for the computational unit 10 are provided by auxiliary computational units 20, 21, 22. Each auxiliary computational unit 20, 21, 22 selects either a signal from a configuration memory M2, M3 and M4 respectively or a signal from the communication network $90_V$ as its input signal. This selection is made in response to an auxiliary selection signal provided by the configuration memory M1.

It is remarked that the scope of protection of the invention is not restricted to the embodiments described herein. Neither is the scope of protection of the invention restricted by the reference numerals in the claims. The word 'comprising' does not exclude other parts than those mentioned in a claim. The word 'a(n)' preceding an element does not exclude a plurality of those elements. Means forming part of the invention may both be implemented in the form of dedicated hardware or in the form of a programmed general purpose processor. The invention resides in each new feature or combination of features.

What is claimed is:

1. A reconfigurable processing device configured as a 4 to 1 multiplexer comprising:
   a decoder;
   a 2 to 1 multiplexer;
   a lookup table, wherein the lookup table comprises a first column of cells comprising values associated with an address A and a second column of cells comprising values associated with an address B; and
   a preprocessor configured to:
      receive inputs x0, x1, x2 and x3 and control signal c1; and
      determine partial products from the inputs x0, x1, x2 and x3 and control signal c1 expressed as y0=$\overline{c1}$·x0, y1=$\overline{c1}$·x1, y2=c1·x2, and y3=c1·x3,
   wherein the decoder is configured to receive y0, y1, y2 and y3 and to generate an address value A=y0+y2 and an address value of B=y1+y3, wherein value A represents an address of the first column and value B represents an address of the second column;
   wherein the decoder is configured to access a first cell of the lookup table at address value A to receive a stored value stored A* at address value A and to access a second cell of the lookup table at address value B to receive a stored value B* stored at address value B, and
   wherein the multiplexer is configured to receive the stored values A* and B* from the lookup table and in response to a control signal c0 to determine an output F, wherein F=$\overline{c0}$·A*+c0·B*.

2. The reconfigurable processing device according to claim 1, wherein the look-up table further comprises a storage unit comprising m columns of $2^k$ storage elements each.

3. The reconfigurable processing device according to claim 1, wherein the preprocessor comprises a mode select input configured to select a further operational mode, in which further operational mode the output signals are identical to their corresponding input signals.

4. The reconfigurable processing device according to claim 1, further comprising an enlarged computational unit having a first and a second computational unit each comprising a preprocessor, an m-output look-up table, and an output multiplexer, the enlarged computational unit further comprising a further multiplexer configured to select an output signal of either the first or the second unit as its output signal in response to a further selection signal.

5. A reconfigurable processing device configured as an "n" to 1 multiplexer comprising:
one or more reconfigurable processing units, wherein a reconfigurable processing unit comprises:
a computational unit having a preprocessing module configured to receive n input signals and s1 input selection signals, and to provide k output signals wherein k<n+s1, wherein the k output signals are partial products of the n input signals and the s1 selection signals, wherein n=k and the preprocessing unit has a first input configured to receive a first selection signal, and wherein the preprocessing unit in an operational mode is configured to generate in response to each of the n input signals an output signal wherein for one half of the output signals the value is the logical AND function of the corresponding input signal and the first selection signal and for another half of the output signals the value is the logical AND function of the corresponding input signal and the inverse of the first selection signal;
an m-output look-up table configured to be addressed by the k output signals of the preprocessing module; and
an output multiplexer configured to select one of the m output signals of the look-up table under control of s2 output signals.

6. The reconfigurable processing device according to claim 5, wherein the look-up table further comprises a k to $2^k$ decoder configured to decode k address signals into $2^k$ address signals and a storage unit comprising m columns of $2^k$ storage elements each.

7. The reconfigurable processing device according to claim 5, wherein the preprocessing unit comprises a mode select input configured to select a further operational mode, in which further operational mode the output signals are identical to their corresponding input signals.

8. The reconfigurable processing device according to claim 5, further comprising an enlarged computational unit having a first and a second computational unit each comprising a preprocessing module, an m-output look-up table, and an output multiplexer, the enlarged computational unit further comprising a further multiplexer configured to select an output signal of either the first or the second unit as its output signal in response to a further selection signal.

9. A reconfigurable processing device configured as an "n" to 1 multiplexer comprising:
one or more reconfigurable processing units, wherein a reconfigurable processing unit comprises:
a computational unit having a preprocessing module configured to receive n input signals and s1 input selection signals, and to provide k output signals wherein k<n+s1, wherein the k output signals are partial products of the n input signals and the s1 selection signals, wherein n=k and the preprocessing unit has a first input configured to receive a first selection signal, and wherein the preprocessing unit in an operational mode is configured to generate in response to each of the n input signals an output signal wherein for one half of the output signals the value is the logical AND function of the corresponding input signal and the first selection signal and for another half of the output signals the value is the logical AND function of the corresponding input signal and the inverse of the first selection signal;
an m-output look-up table configured to be addressed by the k output signals of the preprocessing module;
an output multiplexer configured to select one of the m output signals of the look-up table under control of s2 output signals; and
a mode select input configured to select a further operational mode, in which further operational mode the output signals are identified to their corresponding input signals.

10. The reconfigurable processing device according to claim 9, wherein the look-up table further comprises a k to $2^k$ decoder configured to decode k address signals into $2^k$ address signals and a storage unit comprising m columns of $2^k$ storage elements each.

11. The reconfigurable processing device according to claim 9, further comprising an enlarged computational unit having a first and a second computational unit each comprising a preprocessor, an m-output look-up table, and an output multiplexer, the enlarged computational unit further comprising a further multiplexer configured to select an output signal of either the first or the second unit as its output signal in response to a further selection signal.

12. A reconfigurable processing device configured as an "n" to 1 multiplexer comprising:
one or more reconfigurable processing means, wherein a reconfigurable processing means comprises:
preprocessing means for receiving n input signals and s1 input selection signals, and providing k output signals wherein k<n+s1, wherein the k output signals are partial products of the n input signals and the s1 selection signals;
an m-output look-up table means being addressed by the k output signals of the preprocessing means; and
means for selecting one of them output signals of the look-up table means under control of s2 output signals,
wherein n=k and the preprocessing means has a first input means for receiving a first selection signal, wherein the preprocessing means in an operational mode generates in response to each of the n input signals an output signal wherein for one half of the output signals the value is the logical AND function of the corresponding input signal and the first selection signal and for another half of the output signals the value is the logical AND function of the corresponding input signal and the inverse of the first selection signal.

13. The reconfigurable processing device according to claim 12, wherein the look-up table means further comprises a k to $2^k$ decoder means for decoding k address signals into $2^k$ address signals and a storage unit comprising m columns of $2^k$ storage elements each.

14. The reconfigurable processing device according to claim 12, wherein the preprocessing unit comprises a mode select input means for selecting a further operational mode, in which further operational mode the output signals are identical to their corresponding input signals.

* * * * *